US007827456B2

(12) United States Patent
Zhang et al.

(10) Patent No.: US 7,827,456 B2
(45) Date of Patent: Nov. 2, 2010

(54) ERROR CORRECTION SCHEME FOR A DISC-PLAYING SYSTEM

(75) Inventors: Jiagang Zhang, Shanghai (CN); Jianyi Zhong, Shanghai (CN); Zhongjin Guo, Shanghai (CN); Jacobus Maarten Den Hollander, Eindhoven (NL); Anthonius P. G. E. Janssen, Eindhoven (NL)

(73) Assignee: Koninklijke Philips Electronics, N.V., Eindhoven (NL)

( * ) Notice: Subject to any disclaimer, the term of this patent is extended or adjusted under 35 U.S.C. 154(b) by 762 days.

(21) Appl. No.: 10/599,597

(22) PCT Filed: Mar. 22, 2005

(86) PCT No.: PCT/IB2005/050969

§ 371 (c)(1),
(2), (4) Date: Oct. 3, 2006

(87) PCT Pub. No.: WO2005/098856

PCT Pub. Date: Oct. 20, 2005

(65) Prior Publication Data

US 2007/0226575 A1    Sep. 27, 2007

(30) Foreign Application Priority Data

Apr. 6, 2004    (CN) ........................ 2004 1 0032490

(51) Int. Cl.
*H03M 13/00* (2006.01)
(52) U.S. Cl. ........................ 714/746; 714/725; 714/759; 714/770
(58) Field of Classification Search ................. 714/725, 714/746, 703, 759, 18, 11, 15, 20, 769, 770, 714/763
See application file for complete search history.

(56) References Cited

U.S. PATENT DOCUMENTS 4,564,944 A * 1/1986 Arnold et al. ................ 714/759

(Continued)

FOREIGN PATENT DOCUMENTS

EP    0782048 A2    7/1997

(Continued)

OTHER PUBLICATIONS

Written Opinion of the International Searching Authority PCT/IB2005/050969.

(Continued)

*Primary Examiner*—Fritz Alphonse

(57) ABSTRACT

The present invention provides an error correcting method and apparatus for correcting errors in content. In accordance with a method embodiment, a method is provided for correcting errors in content, comprising, determining the types of the errors; sending a download request over a network for downloading error correcting information according to the type of the errors; receiving the error correcting information from the server; and correcting errors with the correcting information. In accordance with an apparatus embodiment, an error correcting apparatus is provided for correcting errors in the content, comprising a controlling means, a sending means and a receiving means, wherein the controlling means is used to determine the type of errors and to correct the errors with the error correcting information received by the receiving means; the sending means is used to send a download request for downloading the respective error correcting information according to the type of errors; and the receiving means is used to receive the error correcting information.

20 Claims, 7 Drawing Sheets

U.S. PATENT DOCUMENTS

| | | | |
|---|---|---|---|
| 5,386,324 A | | 1/1995 | Fry et al. |
| 5,703,887 A | | 12/1997 | Heegard et al. |
| 5,771,354 A | | 6/1998 | Crawford |
| 5,774,470 A | * | 6/1998 | Nishiya et al. .............. 714/703 |
| 5,784,527 A | | 7/1998 | Ort |
| 5,974,583 A | * | 10/1999 | Joo ........................... 714/784 |
| 6,049,892 A | * | 4/2000 | Casagrande et al. ........... 714/18 |
| 6,189,110 B1 | | 2/2001 | Saitoh et al. |
| 6,378,784 B1 | | 4/2002 | Allen et al. |
| 6,459,851 B1 | | 10/2002 | Sonu |
| 6,480,972 B1 | | 11/2002 | Cromer et al. |
| 6,516,034 B2 | | 2/2003 | Todo et al. |
| 7,039,848 B2 | * | 5/2006 | Inokuchi et al. ............. 714/769 |
| 2002/0099996 A1 | | 7/2002 | Demura et al. |
| 2002/0194569 A1 | | 12/2002 | Freissmann |
| 2003/0014207 A1 | | 1/2003 | Arnaout et al. |
| 2004/0153690 A1 | | 8/2004 | Huang |

FOREIGN PATENT DOCUMENTS

| | | |
|---|---|---|
| EP | 0836187 A1 | 5/1998 |
| EP | 1109395 A2 | 6/2001 |
| JP | 2002117632 A | 4/2002 |
| WO | 0233552 A2 | 4/2002 |
| WO | 0241525 A1 | 5/2002 |
| WO | 2005098856 A1 | 10/2005 |

OTHER PUBLICATIONS

ISR, International Search Report PCT/IB2005/050969.

* cited by examiner

ERROR CORRECTION SCHEME FOR A DISC-PLAYING SYSTEM

BACKGROUND ART

The present invention relates to an error correcting mechanism of the optical disc play system, particularly to a mechanism for correcting errors in the content read out from an optical disc by an optical disc player.

The present day sees very rapid development of the optical storage technology. Today's optical storing media have the advantages of large capacity, high density and small size. With the development of the optical storing media, new types of errors of content stored on these media also emerge incessantly, which greatly affect the play quality of the optical disc.

The methods and apparatuses of the optical disc players in the prior art for correcting the content errors will be described with reference to FIGS. 1 and 2.

FIG. 1 is a block diagram of an optical disc player in the prior art. The optical disc player 10 comprises reading module 110, decoding module 111 and controlling module 112. Reading module 110 reads out content in an optical disc, decoding module 111 decodes the read out content and outputs the decoded content, and controlling module 112 controls the reading process and decoding process, and determines whether there are physical and/or logic errors in the read out content. If there are errors, the controlling module corrects the errors itself or manually. The controlling module can be run by firmware, for example, by the programming commands stored in the ROM. In this context, the physical errors refer to defects in the content read out by an optical disc player from the optical disc, which result from physical damages of the optical disc (such as abrade, shatter crack, incline). Logic errors are that, when encoding data and storing them on optical discs, the encoding method adopted is not complied with standard encoding methods (such as adoption of inaccurate initiate number, invalid DVD navigation information or non-standard video format, or synchronous code missing), which makes it impossible for the controlling module to use the pre-determined method to recognize the content read out from the optical disc and to control the decoding module to decode it.

When there is a defect part (i.e. physical errors) in the read out content, controlling module 112 will instruct the reading module 110 to read it again. However, if the number of the times of the retry exceeds a pre-determined threshold value, the controlling module 112 will instruct the reading module to skip the defect part. After reading, controlling module 112 will control the decoding module 111 to decode the read out content. If in the process of decoding, the read out content is found to be encoded with a non-standard encoding method, and cannot be decoded with the pre-determined decoding method (i.e. logic errors), the firmware in the apparatus has to be updated, so as to decode the read out content with an appropriate decoding method. However to update firmware in the prior art, a player manufacturer has to replace the whole firmware manually or give the user a piece of firmware upgrading software for him to update the firmware himself.

FIG. 2 shows a flow chart of the process of correcting errors in the content read out by an optical disc player in the prior art. Firstly, read the content from an optical disc (step S211). If any defect parts are identified in the read out content, that is, physical errors exist (step S212), then a comparison is made between the number of the retry times and the pre-determined threshold value (step S213). If the number of the retry times is less than the threshold value, the retry time will be increment by 1 (step 214), and the content is read out again (that is, return to step S211). But if the number of the retry times is more than the threshold value, this part of the content will be skipped (step S215). After that, it is determined, in step 216, whether there are logic errors in the read out content or in the content after the physical errors are corrected. If there are logic errors, the firmware will be prompted to be updated manually (step S217), then the content is decoded after correcting the logic errors (step S218). If it is determined in step S216 that there are not any logic errors, jump to step S218 directly and decode the content.

From the above description of the prior art, we can see that the optical disc player adopts a comparatively passive way to correct physical errors, that is, retry to read and if the number of retry exceeds a pre-determined value/number, the content will be skipped. This may result in discontinuous content playing. Besides, in the prior art, logic errors are not corrected in time, which may result in interruption of the play or mosaic on the screen. And to correct logic errors, it is necessary to replace the firmware manually, and, as a result, the whole error correcting process becomes rather complicated and inconvenient.

DISCLOSURE OF THE PRESENT INVENTION

One of the objects of the present invention is to provide a new error correcting method and apparatus that can address the problems mentioned above.

According to the first aspect of the present invention, it provides a method for correcting errors in the content, comprising the following steps: determining the types of the errors; sending a download request for downloading error correcting information according to the type of the errors; receiving the error correcting information; and correcting errors with the correcting information.

According to the second aspect of the present invention, it provides a method for a provider to provide error correcting information to correct errors in the content, comprising the steps: receiving a download request corresponding to the errors; determining the presence of error correcting information corresponding to the download request; in the absence of error correcting information corresponding to the download request, obtaining new error correcting information; and sending error correcting information corresponding to the download request.

According to the third aspect of the present invention, it provides an apparatus for correcting errors in the content, comprising a controlling means, a sending means and a receiving means, wherein the controlling means is used to determine the type of said errors and to correct said errors with the error correcting information received by said receiving means; said sending means is used to send a download request for downloading the respective error correcting information according to the type of said errors; and the receiving means is used to receive said error correcting information.

According to the forth aspect of the present invention, it provides a player, comprising a reading means, a controlling means, a sending means, a receiving means and a decoding means, wherein: said reading means reads out content; said controlling means determines the presence of any defect parts in the read out content, controls the sending means to send a download request for downloading the respective defect parts, and adds the defect part received by said receiving means from the network to said read content to provide the corrected content; and said decoding means decodes said corrected content and plays it.

Through the following description in combination with the accompanying drawings and the content of the claims and with the further understanding of the present invention, the other objects and effects of the present invention will become more apparent and be more readily understood.

BRIEF DESCRIPTION OF THE FIGURES

With reference to the figures, the foregoing and other features of the present invention will become apparent with the help of the following specific description of the preferred embodiment of the present invention. In these figures, the same references are used for respective parts.

SPECIFIC EMBODIMENTS

The error correcting means and method of the optical disc play system of the present invention will be specifically described with reference to FIGS. 3 to 7.

Figure 1:
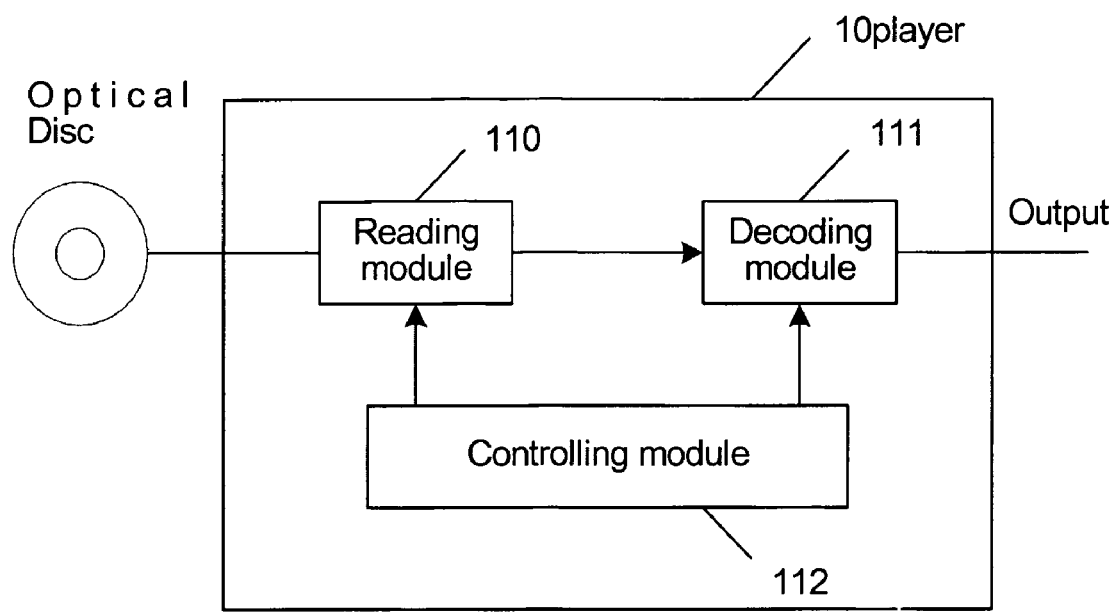
FIG. 1 shows the block diagram of the configuration of the optical disc in the prior art.
Figure 2:
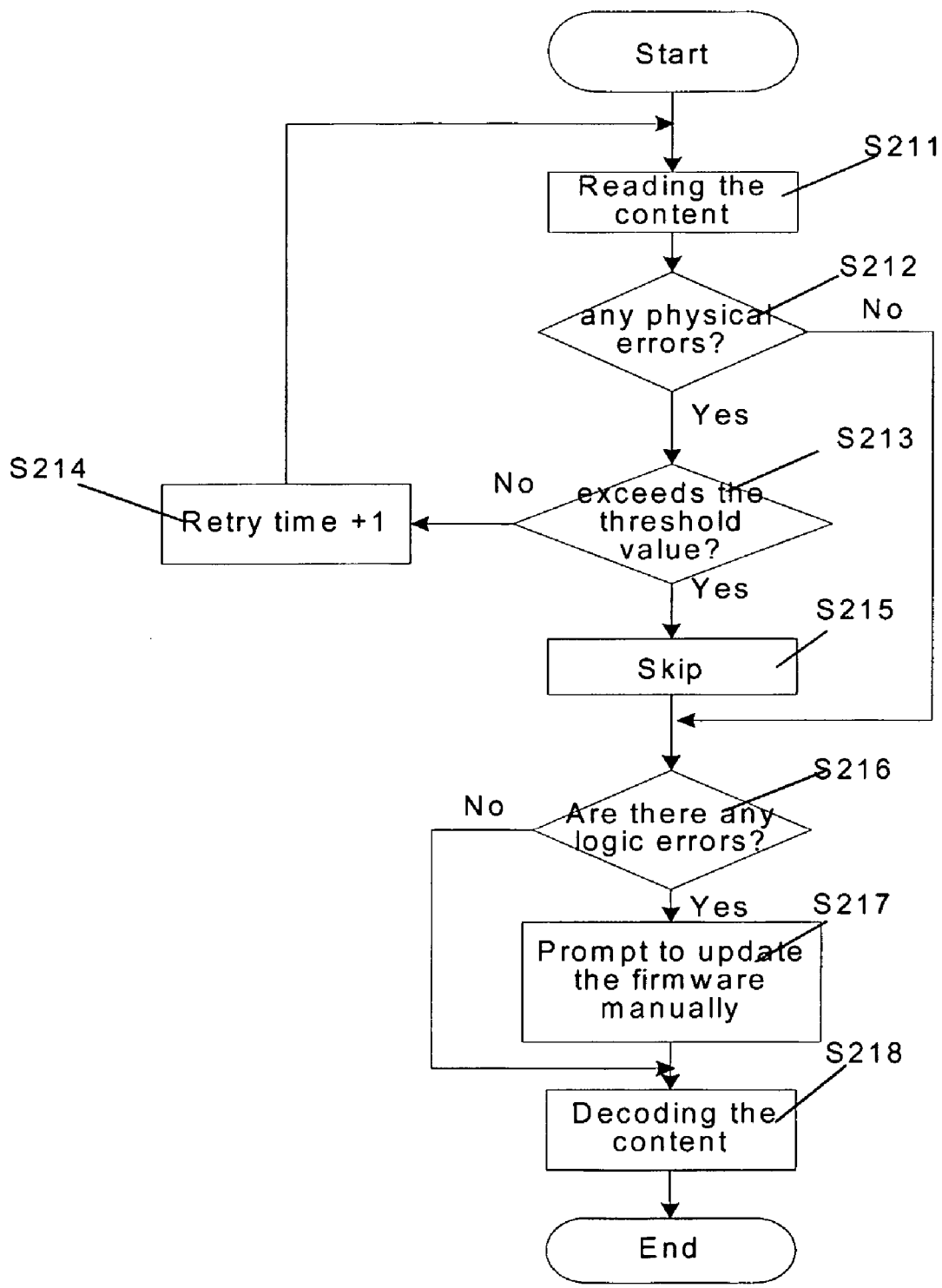
FIG. 2 shows the flow chart of a process for correcting errors in the content read out by the optical disc player in the prior art.
Figure 3:
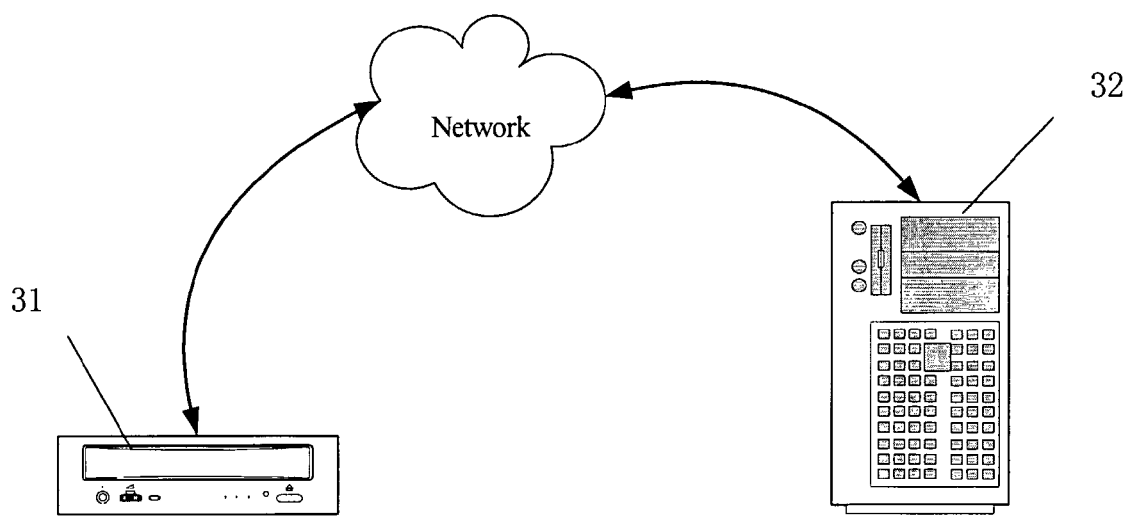
FIG. 3 illustrates the optical disc play system according to the preferred embodiment of the present invention.

FIG. 3 illustrates the optical disc play system according to the preferred embodiment of the present invention. Optical disc play system 30 includes optical disc player 31 connected to server 32 via the network. Server 32 is used to provide the error correcting information to the optical disc player, and the optical disc player corrects errors in the content read out from the optical disc with the error correcting information provided and plays it.

Figure 4:
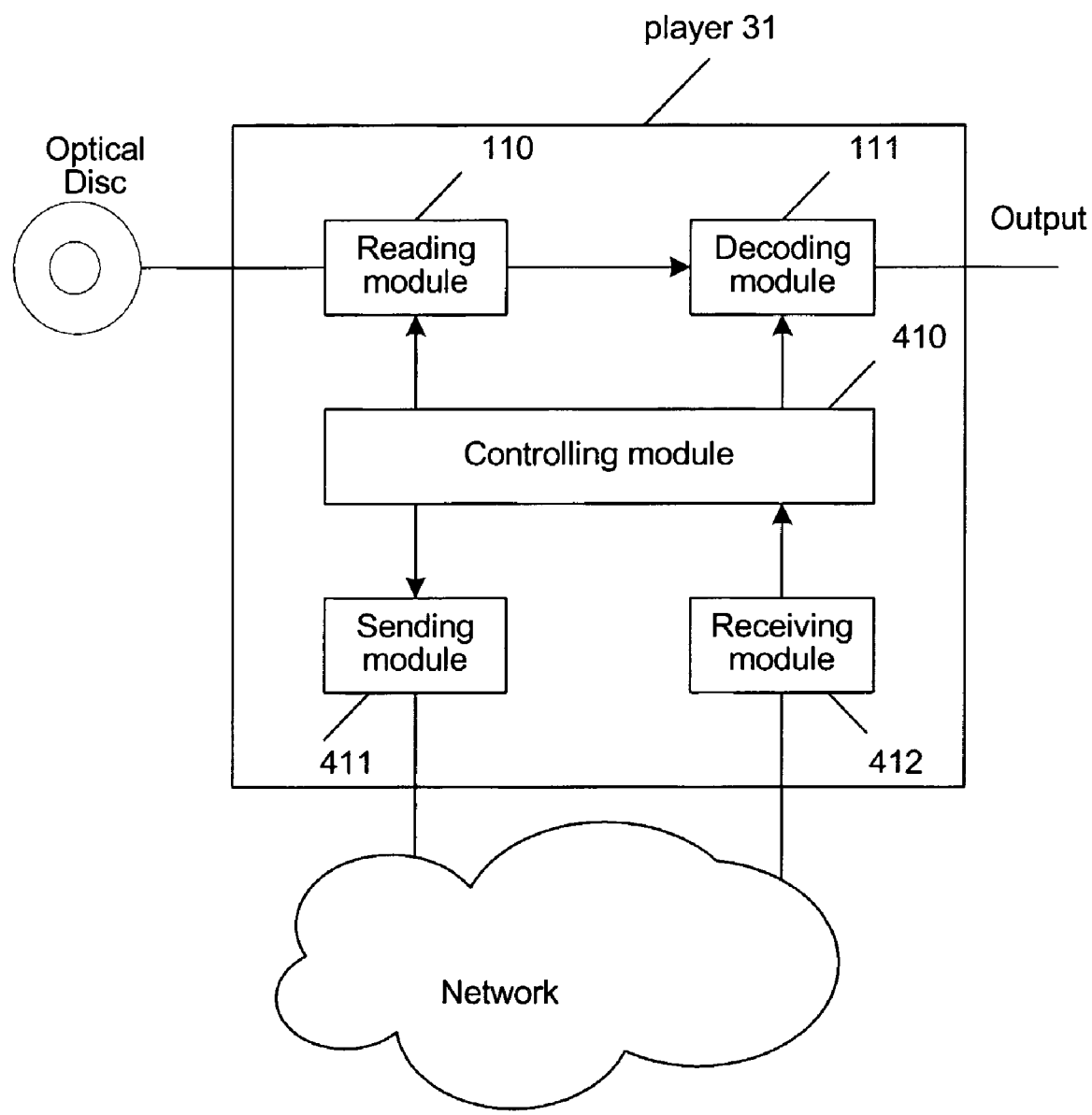
FIG. 4 shows the block diagram of the configuration of the optical disc player of the optical disc play system shown in FIG. 3.

FIG. 4 shows the block diagram of the configuration of the optical disc player of the optical disc play system shown in FIG. 3. According to the preferred embodiment, optical disc player 31 includes reading module 110, decoding module 111, controlling module 410, sending module 411 and receiving module 412, wherein the controlling module is implemented by the firmware.

When controlling module 410 detects a defect part in the content read out by reading module 110 from the optical disc, it instructs the sending module to send a request for downloading the defect part of the content to the respective server (e.g. server 32 in FIG. 3) via the network. The request includes the identification number of the optical disc and the initiate address (usually, the initiate address is indicated in the dada report header of the defected part) of the defect part in the read out content.

Then, controlling module 410 receives the defect content from the server. Under the control of controlling module 410, the read out content will be added to the received content according to the initiate address, so as to form complete content to be read. Then, controlling module 410 determines if there are logic errors in the content, if there are errors, the firmware used to perform the control functions of reading and decoding of the controlling module needs to be updated. At this time, controlling module 410 controls sending module 411 to send, to said server via the network, the request for downloading the respective information of a new firmware release, the new release information may be the codes for upgrading the firmware. The download request may include the disc identifier number, the information related to the old firmware release and the type of the logic errors (such as a wrong initiate number, invalid DVD navigating information), the receiving module 412 receives the information related to the new firmware release from the server. Then, controlling module 410 upgrades the firmware with the information, and controls decoding module 111 to decode the read content with the upgraded firmware.

Figure 5:
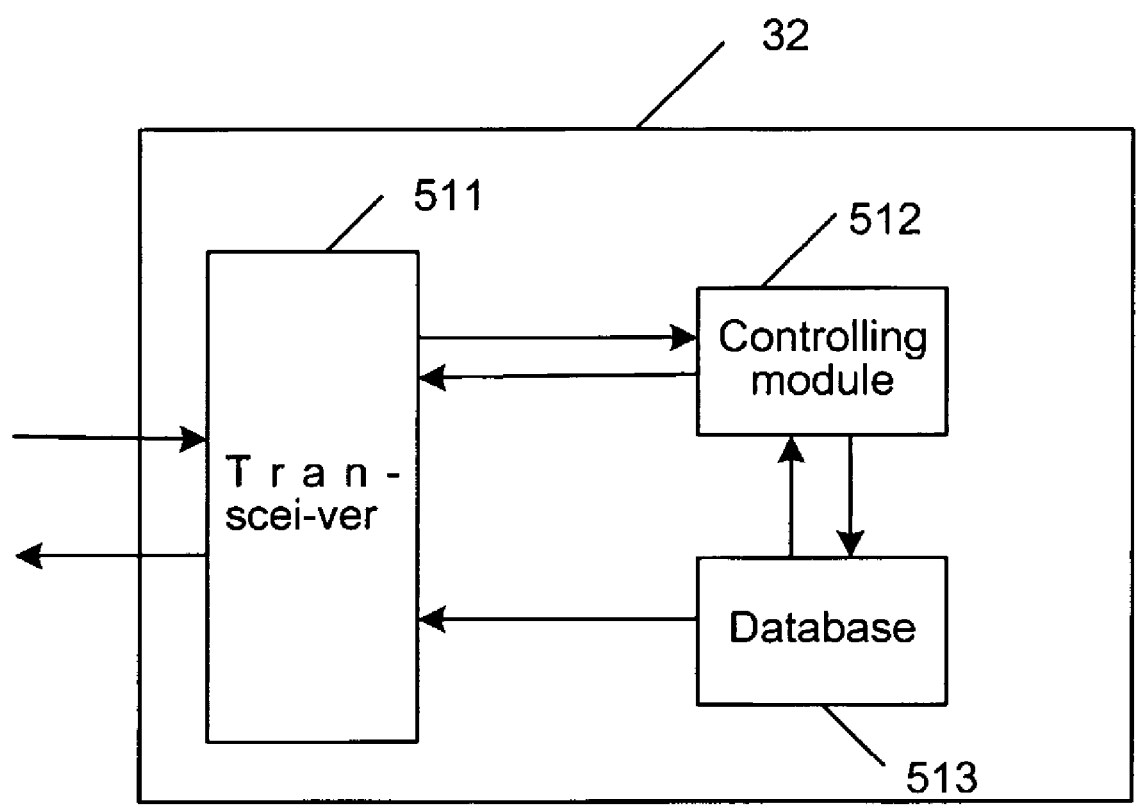
FIG. 5 shows the block diagram of the configuration of the support system of the optical disc play system shown in FIG. 3.

FIG. 5 shows the block diagram of the configuration of sever 32 of the optical disc play system shown in FIG. 3. The server includes transceiver 511, controlling means 512 and database 513.

Transceiver 511 receives a download request from the optical disc player for downloading the error correcting information. The request corresponds to the type of the errors. Controlling means 512 determines, according to the content of the download request, whether there is the needed information stored in the database 513. If there is, controlling means 512 will control database 513 to send the error correcting information to transceiver 511, and transceiver 511 will pass the information to the player. But if there is not, controlling means 512 will control the transceiver 511 to obtain error correcting information from other servers (not shown) via the network. Of course, the programmer can work out his program according to the error information and store the programs in database 513. Then transceiver 511 will pass the error correcting information to the player.

Figure 6:
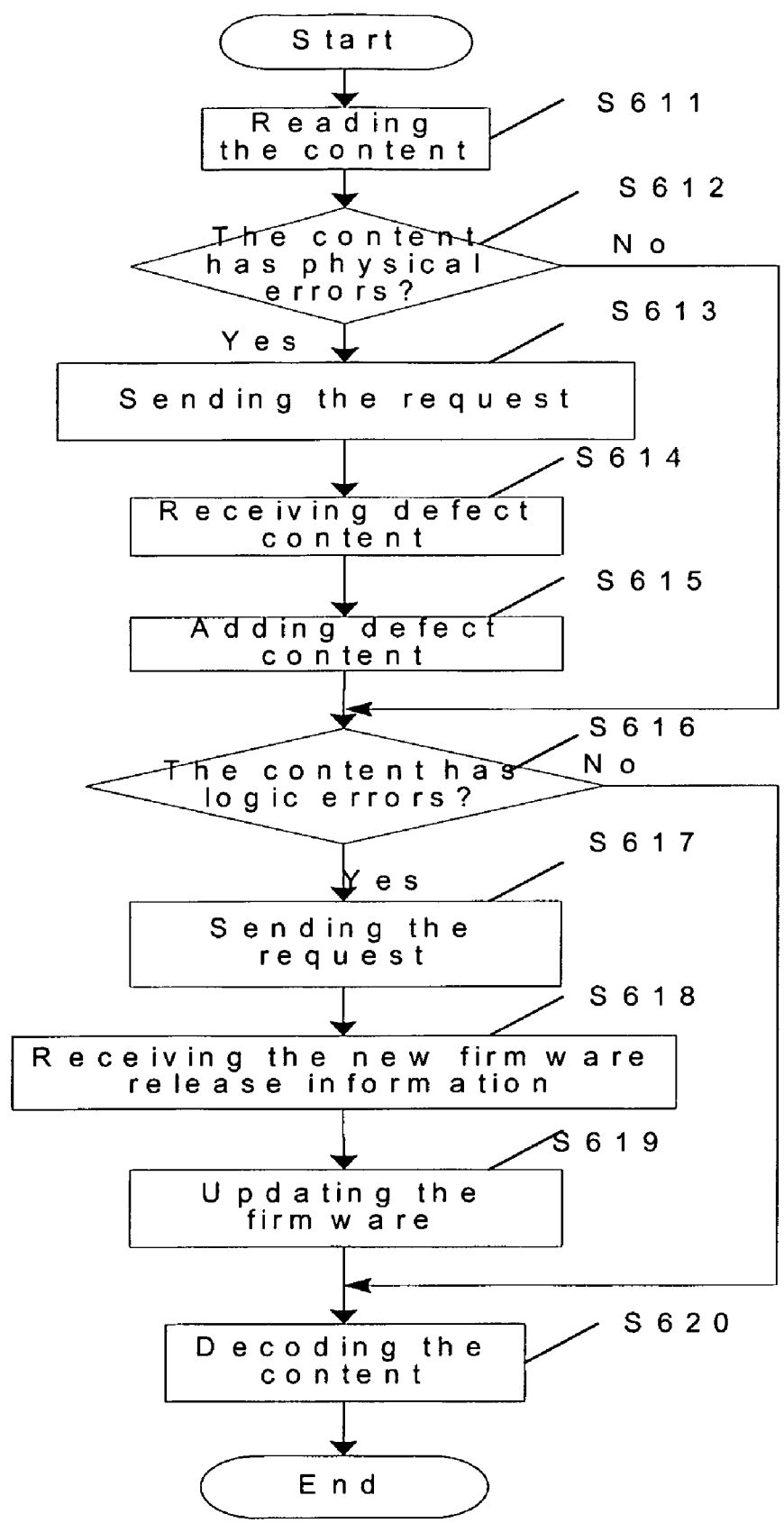
FIG. 6 shows the flow chart of a process for correcting errors in the content read by the optical disc player shown in FIG. 4.

FIG. 6 shows the flow chart of a process of the optical disc player shown in FIG. 4 to correct errors in the content read. As shown in FIG. 6, firstly read the content from the optical disc (step S611). Then determine whether there are physical errors in the content (step S612). If there are defects, send the request for downloading the defect content via the network (step S613), then receive the defected content (step S614) and add it to the former read out content according to the initiate address of the content to form the complete correct read out content (step S615). However, when it is determined that there are no physical errors in the read out content, then jump to step S616 directly to determine whether there are logic errors in the content.

If it is determined that there are logic errors in the read out content in step S616, then send the download request for downloading the information related to the new firmware release (step S617). If there are no logic errors, jump to step S620 to decode the content. After sending the download request, receive the information related to the new firmware release in step 618, and correct the logic errors with the information in step 619, i.e. update the firmware with the information related to the new firmware release. Then, decode the read out content with the updated firmware in step 620.

Figure 7:
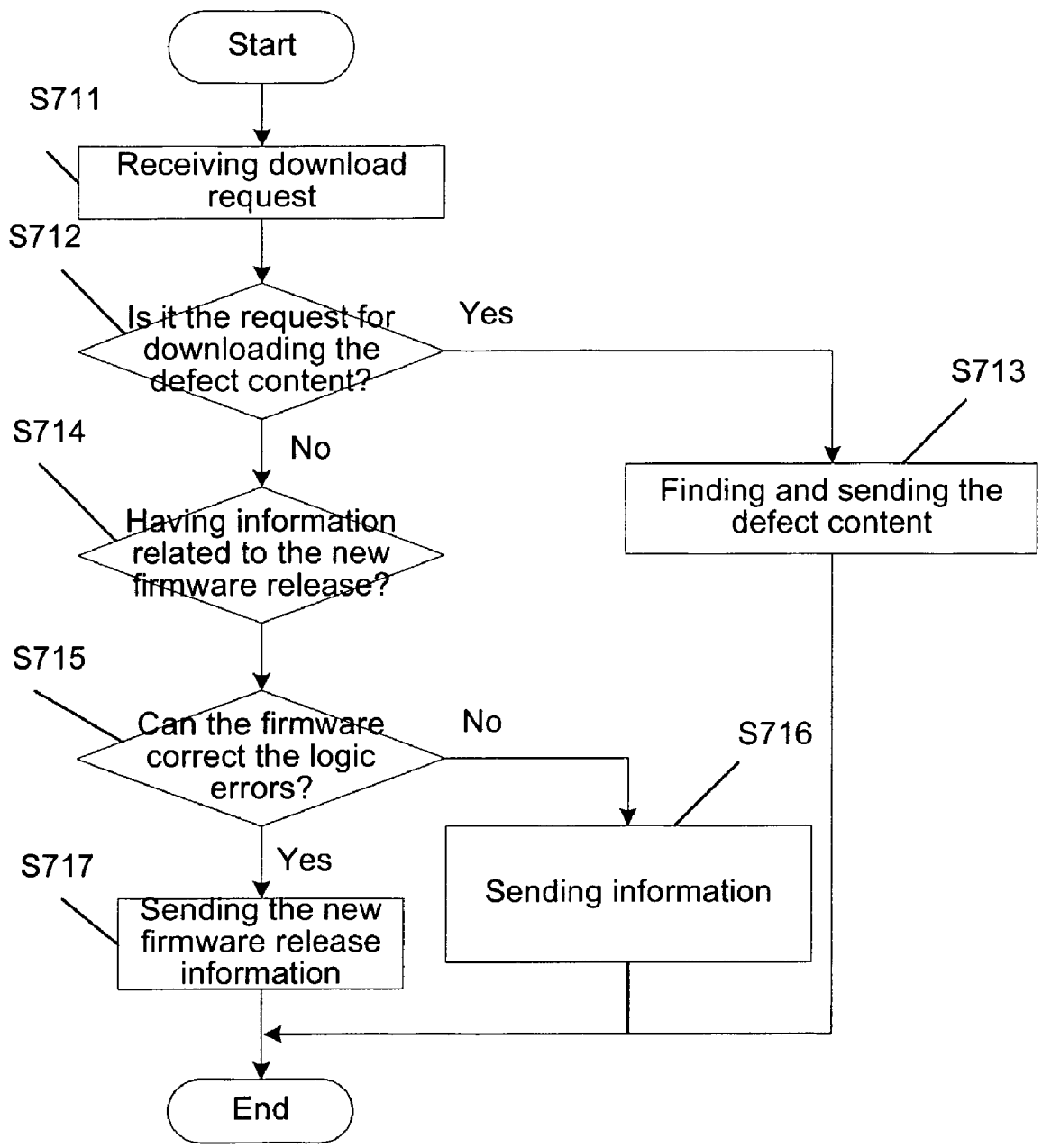
FIG. 7 shows the flow chart of a process for the server sub-system of the support system shown in FIG. 5 to provide error correcting information.

FIG. 7 shows the flow chart of the process of the server shown in FIG. 5 to provide the error correcting information. As shown in FIG. 7, firstly receive the download request from the player (step 711). The request corresponds to the type of the errors and includes the information related to the errors, that is, the physical errors correspond to a request for downloading the defect content, and the request includes the initiate address of the defect content; the logic errors correspond to the request for downloading the information related to the new firmware release, and the request includes the related type of the logic errors and the information related to old firmware release, etc. Then, determine whether this request is a request for downloading the defect content (step 712). If it is, find and send the defect content according to the initial address of the defect content (step S713). If the request is not a request for downloading the defect content, i.e. it is a request for downloading the information related to the new firmware release, then determine, according to the information related to the old firmware release, whether there is a new firmware release that is newer than the old one (step S714). If the answer is yes, then determine, according to the information related to the logic errors, whether the information related to this new firmware release can correct the logic errors (step S715). If it can, go to step S717, that is, send the information to the player. If there is no said information related to a new firmware release or if the information exists, but cannot correct the logic errors, inform the player and supplier that the information of the new firmware release cannot be obtained (step S716).

The forgoing description of the preferred embodiment of the present invention shows that the optical disc player of the present invention obtains error correcting information from the support system via the network, and corrects errors in the read out content with the information, so that it not only ensures the integrality and continuality of the content played, but also saves time and energy, and makes the operation convenient and fast.

Above is a description of the preferred embodiment of the present invention. Those skilled in the art should now be in a position to understand that, according to the principles revealed in the present invention, other modifications of the present invention are feasible and fall within the scope of the claims. For example, the present invention, which can be used in an optical disc player, can certainly also be used in any player of other storage media (e.g. a PC). The preferred embodiment of the present invention corrects the physical errors and the logic errors in the read out. Of course, it can correct only one or any other types of errors, such as the error that the updated disc format cannot be played by a player of an old model. Furthermore, although the preferred embodiment of the present invention corrects the errors in the read out content, it should be understood that the present invention can also be used to correct other errors. For example, it can correct the errors generated in a process of the internal operation of the whole player (or other apparatuses). In this case, the firmware in the player controls the entire operation process. When the firmware cannot identify or correct the errors, the firmware needs to be updated with the method of the present invention. Of curse, all these should fall within the scope of the accompanied claims.

What is claimed is:

1. A method for correcting an error in content in a storage medium play system, the system including at least a controlling module, reading means, sending means and receiving means, the method comprising steps of:
   (a) determining, by said controlling module, an error type from content read out by said reading means;
   (b) issuing, by said controlling module, an instruction to said sending means to issue a download request over a network for downloading error correcting information over said network, according to the error type determined at said step (a);
   (c) receiving the error correcting information over said network by said receiving means, responsive to said request; and
   (d) correcting the errors at the storage medium play system using the error correcting information provided over said network.

2. The method according to claim 1, wherein the error type comprises at least one of a physical error and a logical error.

3. The method according to claim 2, wherein step (a) comprises the step of said controlling module determining that a physical error exists in the content if a missed or damaged portion exists in the content.

4. The method according to claim 3, wherein the download request is a request for downloading the original content corresponding to the missed or damaged portion, the request comprises a start address of the missed or damaged portion.

5. The method according to claim 4, wherein step (d) comprises the step of adding the downloaded original content to the content according to the start address of the missed or damaged portion.

6. The method according to claim 2, wherein step (a) comprises the step of determining that a logical error exists in the content if the content is unable to be identified using an original firmware release for controlling the operations of said controlling module.

7. The method according to claim 6, wherein the download request is a request for down-loading the information corresponding to a new firmware release, the request comprises the information corresponding to an original firmware release and the type of the logical error.

8. The method according to claim 7, wherein the step (d) comprises the step of renewing the original firmware release according to the information corresponding to the new firmware release.

9. A method for correcting an error in content by a server supplying error correcting information to a storage medium play system, comprising steps of:
   (a) receiving a download request at the server from the storage medium play system for downloading the error correcting information corresponding to an error type identified by the storage medium play system;
   (b) determining, at the server, whether the error correcting information corresponding to the error type identified in the download request exists;
   (c) obtaining, at the server, new error correcting information if the error correcting information corresponding to the error type identified in the download request does not exist; and
   (d) sending the error correcting information corresponding to the download request from the server to the storage medium play system.

10. The method according to claim 9, wherein the error comprises at least one of a physical error and a logical error.

11. The method according to claim 10, wherein
   the download request corresponding to the physical error is a request for downloading an original content corresponding to a missed or damaged portion, the request comprises a start address of the missed or damaged portion; and
   the download request corresponding to the logical error is a request for downloading information corresponding to a new firmware release, the request comprises information corresponding to an original firmware release and a type of the logical error.

12. The method according to claim 11, wherein the error correcting information corresponding to the download request comprises the original content corresponding to the missed or damaged portion and the information corresponding to the new firmware release.

13. The method according to claim 12, wherein the step (b) comprises:
    determining the type of the download request;
    finding the original content corresponding to the missed or the damaged portion to be downloaded according to the start address if the request is the request for downloading the original content corresponding to the missed or the damaged portion.

14. The method according to claim 12, wherein the step (b) comprises:
    determining the error type of the download request;
    determining whether the information corresponding to a new firmware release newer than the original firmware release is stored according to the information corresponding to the original firmware release if a request is the request for down-loading the information corresponding to the new firmware release.

15. The method according to claim 14, wherein the step (b) further comprises step of determining whether the logical error can be corrected using the information corresponding to the new firmware release according to the type of the logical error if the information corresponding to the new firmware release is newer than the original firmware release.

16. An error correcting apparatus for correcting an error in content, the apparatus: comprising:
    i) reading means being configured to read said content from an optical disc;
    ii) the controlling means being configured to:
        a) determine an error type from said content read out by said reading means;
        b) issue instructions to said sending means to issue a download request over a network for downloading error correcting information for correcting the error according to the determined error type; and
        c) correct the error with error correcting information received by receiving means;
    iii) sending means being configured to send a download request over said network, responsive to said issued instruction from said controlling means for downloading the respective error correcting information according to the error type;
    iv) the receiving means being configured for receiving the error correcting information over said network, responsive to said download request issued by said sending means over said network.

17. The apparatus according to claim 16, wherein the controlling means comprises a firmware for controlling error correcting.

18. The apparatus according to claim 16, wherein the error type comprises a physical error type and a logical error type.

19. A player, comprising:
    a) reading means configured to read content from an optical disc;
    b) controlling means being configured to:
        i) determine an error type from said content read out by said reading means;
        ii) issue instructions to said sending means to issue a download request over a network for downloading error correcting information for correcting the error according to the determined error type;
        iii) correct the error with error correcting information received by the receiving means;
    c) sending means configured to send a download request over said network, responsive to said issued instruction from said controlling means for downloading the respective error correcting information according to the error type;
    d) reading means configured for receiving the error correcting information over said network, responsive to said download request issued by said sending means over said network;
    e) decoding means for decoding and playing the corrected content.

20. The player according to claim 19, wherein
    the controlling means is also used to determine whether the read content and the corrected content can be decoded in an old firmware release, and to control the sending means to send a download request to ask for downloading information corresponding to a new firmware release, and to renew the original firmware release by means of the information corresponding to the new firmware release received by the receiving means; and
    the decoding means is also used to decode and play the read content and the corrected content according to the new firmware release.

* * * * *